(12) United States Patent
Bickerstaff et al.

(10) Patent No.: US 8,693,969 B2
(45) Date of Patent: Apr. 8, 2014

(54) TEMPERATURE COMPENSATION IN A TELECOMMUNICATIONS DEVICE

(75) Inventors: Jacqueline Bickerstaff, Daventry (GB); Thomas Winiecki, Reading (GB)

(73) Assignee: Intel IP Corporation, Santa Clara, CA (US)

( * ) Notice: Subject to any disclaimer, the term of this patent is extended or adjusted under 35 U.S.C. 154(b) by 93 days.

(21) Appl. No.: 13/266,190

(22) PCT Filed: Apr. 28, 2010

(86) PCT No.: PCT/GB2010/050693
§ 371 (c)(1), (2), (4) Date: Dec. 6, 2011

(87) PCT Pub. No.: WO2010/125388
PCT Pub. Date: Nov. 4, 2010

(65) Prior Publication Data
US 2012/0069871 A1    Mar. 22, 2012

Related U.S. Application Data

(60) Provisional application No. 61/173,800, filed on Apr. 29, 2009.

(51) Int. Cl.
*H04B 1/16* (2006.01)
*H03L 1/02* (2006.01)

(52) U.S. Cl.
USPC ........................................ 455/258; 455/192.1

(58) Field of Classification Search
USPC ........ 455/192.1, 192.2, 226.1, 255, 256, 257, 455/258, 260, 264, 259
See application file for complete search history.

(56) References Cited

U.S. PATENT DOCUMENTS

| | | | | |
|---|---|---|---|---|
| 4,939,786 | A | * | 7/1990 | McCallum et al. ......... 455/67.11 |
| 5,629,708 | A | * | 5/1997 | Rodal et al. .............. 342/357.63 |

(Continued)

FOREIGN PATENT DOCUMENTS

| | | |
|---|---|---|
| WO | 01/86316 A2 | 11/2001 |
| WO | 03/073629 A1 | 9/2003 |

(Continued)

OTHER PUBLICATIONS

International Search Report in corresponding International Application No. PCT/GB2010/050693 mailed Jul. 6, 2010.

*Primary Examiner* — Blane J Jackson

(57) ABSTRACT

A communications device, such as a GNSS receiver comprises an oscillator, having a temperature-dependent frequency characteristic, for generating signals at a nominal frequency; receiver circuitry, for receiving transmitted wireless signals using the signals generated by the oscillator; at least one temperature sensor, having a known positional relationship to the oscillator; an estimation device, for estimating a frequency of the signals generated by the oscillator, based on a measurement from the temperature sensor, and based on the temperature-dependent frequency characteristic of the oscillator; and at least one heat source. A change in the temperature of the oscillator is predicted, based on a state of the heat source, and further based on a model of the thermal properties of the communications device, and hence a change in the frequency of the signals generated by the oscillator is predicted, based on the temperature-dependent frequency characteristic of the oscillator. The receiver circuitry uses the estimated frequency of the signals generated by the oscillator, and the predicted change in the frequency of the signals generated by the oscillator, in receiving the transmitted wireless signals.

20 Claims, 3 Drawing Sheets

(56) References Cited

U.S. PATENT DOCUMENTS

| | | | |
|---|---|---|---|
| 5,654,718 A | 8/1997 | Beason et al. | |
| 6,111,540 A | 8/2000 | Krasner | |
| 6,122,506 A * | 9/2000 | Lau et al. | 455/427 |
| 6,630,872 B1 * | 10/2003 | Lanoue et al. | 331/176 |
| 6,965,754 B2 | 11/2005 | King | |
| 7,012,563 B1 * | 3/2006 | Bustamante et al. | 342/357.62 |
| 7,024,215 B2 | 4/2006 | Krasner | |
| 7,098,749 B2 * | 8/2006 | Forrester | 331/176 |
| 7,239,857 B2 * | 7/2007 | Abraham | 455/255 |
| 7,359,711 B2 | 4/2008 | Edge et al. | |
| 7,459,984 B2 | 12/2008 | Wang et al. | |
| 7,477,189 B2 | 1/2009 | Wang et al. | |
| 7,538,620 B1 * | 5/2009 | Hu et al. | 331/14 |
| 7,865,158 B2 * | 1/2011 | Bultan et al. | 455/192.2 |
| 7,929,928 B2 * | 4/2011 | Babitch et al. | 455/139 |
| 2002/0173284 A1 * | 11/2002 | Forrester | 455/255 |
| 2003/0068977 A1 | 4/2003 | King | |
| 2003/0087617 A1 * | 5/2003 | Shohara | 455/192.2 |
| 2003/0184399 A1 | 10/2003 | Lanoue et al. | |
| 2003/0214436 A1 | 11/2003 | Voor et al. | |
| 2004/0209625 A1 | 10/2004 | Haddrell | |
| 2006/0267703 A1 | 11/2006 | Wang et al. | |
| 2007/0104298 A1 | 5/2007 | Filipovic et al. | |
| 2007/0155413 A1 * | 7/2007 | Kerstenbeck | 455/502 |
| 2008/0085693 A1 * | 4/2008 | Harms | 455/255 |
| 2008/0164952 A1 | 7/2008 | Babitch | |
| 2008/0180321 A1 | 7/2008 | Wang et al. | |
| 2008/0303601 A1 | 12/2008 | Young | |
| 2009/0002225 A1 | 1/2009 | McBurney et al. | |
| 2009/0253386 A1 * | 10/2009 | Gagnon et al. | 455/90.1 |

FOREIGN PATENT DOCUMENTS

| | | |
|---|---|---|
| WO | 03/090380 A1 | 10/2003 |
| WO | 2006/031672 A2 | 3/2006 |
| WO | 2007/076541 A2 | 7/2007 |
| WO | 2008/021810 A2 | 2/2008 |
| WO | 2008/094962 A2 | 8/2008 |

* cited by examiner

TEMPERATURE COMPENSATION IN A TELECOMMUNICATIONS DEVICE

BACKGROUND

This invention relates to a telecommunications device, and in particular to a method for compensating for changes in the temperature of the device, and to a device operating in accordance with the method.

Typically, telecommunications devices include an oscillator, which is used to generate signals at a known frequency, in order to be able to transmit and receive signals successfully at the required frequencies. It is known that such oscillators have temperature dependent frequency characteristics. Where the signals need to be generated such that their frequency is known with a very high degree of accuracy and stability, for example in Global Navigation Satellite System (GNSS) receivers, it is common to try to minimize, and then to compensate for, changes in the temperature of the oscillator.

U.S. Pat. No. 6,630,872 relates to a communications receiver, in which signal reception relies on a signal generated by an oscillator circuit in the receiver. It is known that such oscillator circuits are sensitive to changes in ambient temperature, and the document discloses a system in which a temperature sensor is coupled to the oscillator. A thermal model of the oscillator and its environment is used, so that a temperature value generated by the temperature sensor can be used to estimate a true temperature of the oscillator. Knowledge of the temperature-frequency characteristic of the oscillator can then be used to estimate the true frequency of the signal generated by the oscillator circuit.

SUMMARY

According to a first aspect of the present invention, there is provided a communications device, comprising: an oscillator, having a temperature-dependent frequency characteristic, for generating signals at a nominal frequency; receiver circuitry, for receiving transmitted wireless signals using the signals generated by the oscillator; at least one temperature sensor, having a known positional relationship to the oscillator; an estimation device, for estimating a frequency of the signals generated by the oscillator, based on a measurement from the temperature sensor, and based on the temperature-dependent frequency characteristic of the oscillator; at least one heat source; a prediction device, for predicting a change in temperature of the oscillator, based on a state of the heat source, and further based on a model of the thermal properties of the communications device, and hence for predicting a change in the frequency of the signals generated by the oscillator, based on the temperature-dependent frequency characteristic of the oscillator, wherein the receiver circuitry uses the estimated frequency of the signals generated by the oscillator, and the predicted change in the frequency of the signals generated by the oscillator, in receiving the transmitted wireless signals.

According to a second aspect of the present invention, there is provided a method of operation of a communications device, the communications device comprising: an oscillator, having a temperature-dependent frequency characteristic, for generating signals at a nominal frequency; receiver circuitry, for receiving transmitted wireless signals using the signals generated by the oscillator; at least one temperature sensor, having a known positional relationship to the oscillator; and at least one heat source; the method comprising: estimating a frequency of the signals generated by the oscillator, based on a measurement from the temperature sensor, and based on the temperature-dependent frequency characteristic of the oscillator; predicting a change in temperature of the oscillator, based on a state of the heat source, and further based on a model of the thermal properties of the communications device, and hence predicting a change in the frequency of the signals generated by the oscillator, based on the temperature-dependent frequency characteristic of the oscillator, and using the estimated frequency of the signals generated by the oscillator, and the predicted change in the frequency of the signals generated by the oscillator, in receiving the transmitted wireless signals in the receiver circuitry.

This has the advantage that the device can react more quickly to rapid changes in oscillator temperature caused by system activity, and thereby reduce transient frequency errors that occur with conventional temperature controlled crystal oscillators (TCXOs).

DETAILED DESCRIPTION

Figure 1:
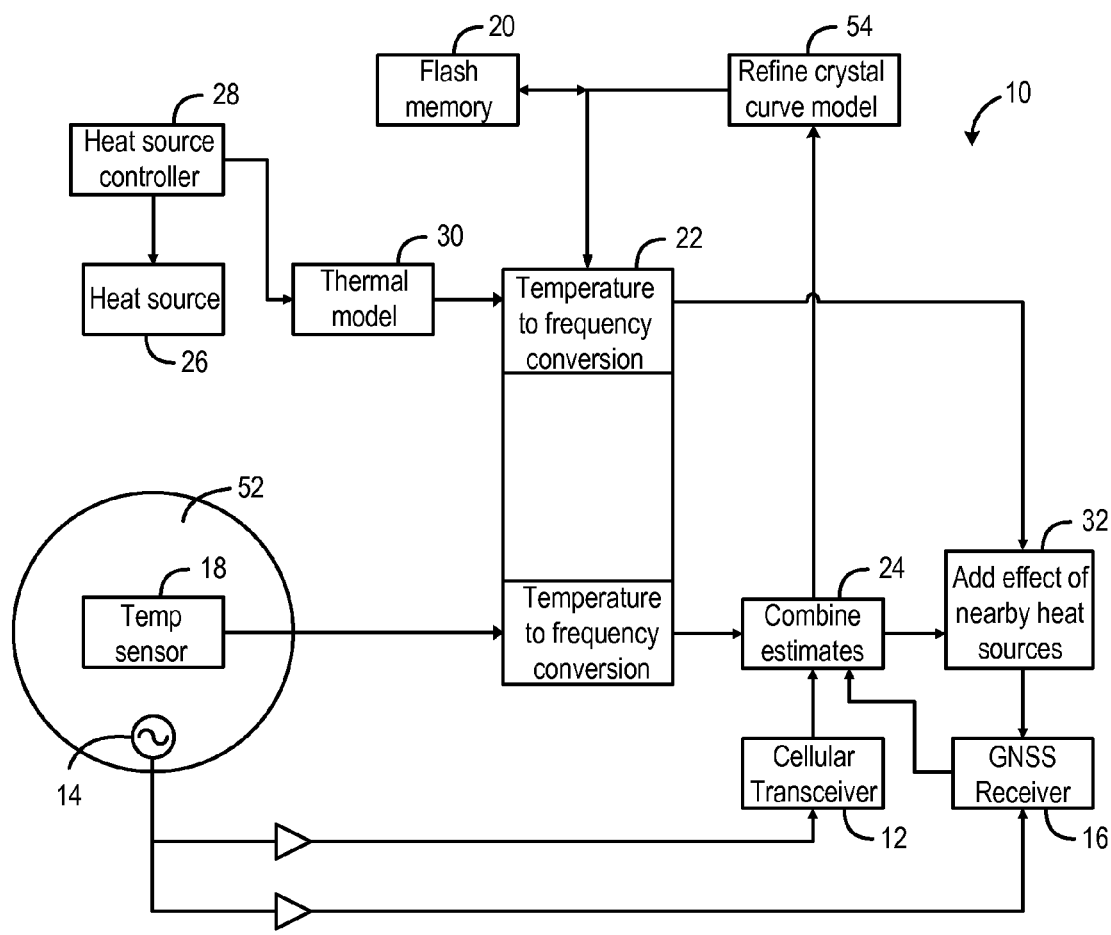
FIG. 1 is a block schematic diagram of a communications receiver in accordance with an aspect of the invention.

FIG. 1 illustrates a communications receiver 10. It will be appreciated that FIG. 1 is a functional representation of the communications receiver. Thus, while several of the functions of the receiver are shown as separate blocks in FIG. 1, in practice they might all be performed in a single suitable programmed processor.

As is conventional, various components of the receiver 10 are provided in separate integrated circuit devices, mounted on a printed circuit board (PCB).

In this illustrated embodiment, the communications receiver 10 is suitable for operation as a portable communications device, such as a cellular handset, and therefore includes cellular transceiver circuitry 12, which is generally conventional, except as described below.

As is conventional, the cellular transceiver circuitry 12 operates on the basis of a clock signal, having a known nominal frequency, which is generated on the basis of a signal received from an oscillator 14. In this illustrated embodiment, the oscillator 14 does not need to be provided with any temperature compensation, thereby allowing the use of a low-cost crystal oscillator. The crystal oscillator will have a frequency-temperature characteristic in the form of a curve, which can be characterised by a number of parameters, as discussed in more detail below.

In this illustrated embodiment, the communications receiver 10 further includes a Global Navigation Satellite System (GNSS) receiver circuit 16, as will be described in more detail below. In the architecture shown in FIG. 1, the temperature compensation is performed within the GNSS receiver using accurate knowledge of the frequency of the oscillator, as well as the rate of change of the frequency (i.e. the frequency drift rate). The rate of change of the frequency drift rate (i.e. the frequency acceleration) is not directly estimated from frequency measurements.

The rate of change of frequency drift rate can be written as $$\partial^2 f/\partial t^2 = \partial/\partial t(\partial f/\partial T \cdot \partial T/\partial t)$$

$$\partial^2 f/\partial t^2 = \partial^2 f/\partial T^2 \cdot (\partial T/\partial t)^2 + \partial f/\partial T \cdot \partial^2 T/\partial t^2$$

where f is frequency, t is time, and T is temperature.

Thus, the frequency acceleration depends on the crystal curve curvature multiplied with temperature drift squared and crystal curve slope multiplied with temperature acceleration. Due to the sine-wave like crystal profile the two terms add up orthogonally, i.e. when the curvature is large the slope is small and the other way around. Using figures for a typical communications device, the crystal profile curvature is around 36 ppb/$K^2$ at the turning points which leads together with a frequency drift of 0.15 K/s to frequency acceleration of around 0.8 ppb/$s^2$. At this level, frequency acceleration is negligible, and accurate frequency tracking can be performed based on linearly extrapolating the estimated frequency drift in time. The second term in the above equation may lead to higher frequency acceleration in the presence of thermal shocks (i.e. large temperature acceleration) typically caused by heat sources that located close to the crystal unit. To retain high sensitivity of the GNSS receiver, such thermal shocks need to be taken into account.

Figure 2:
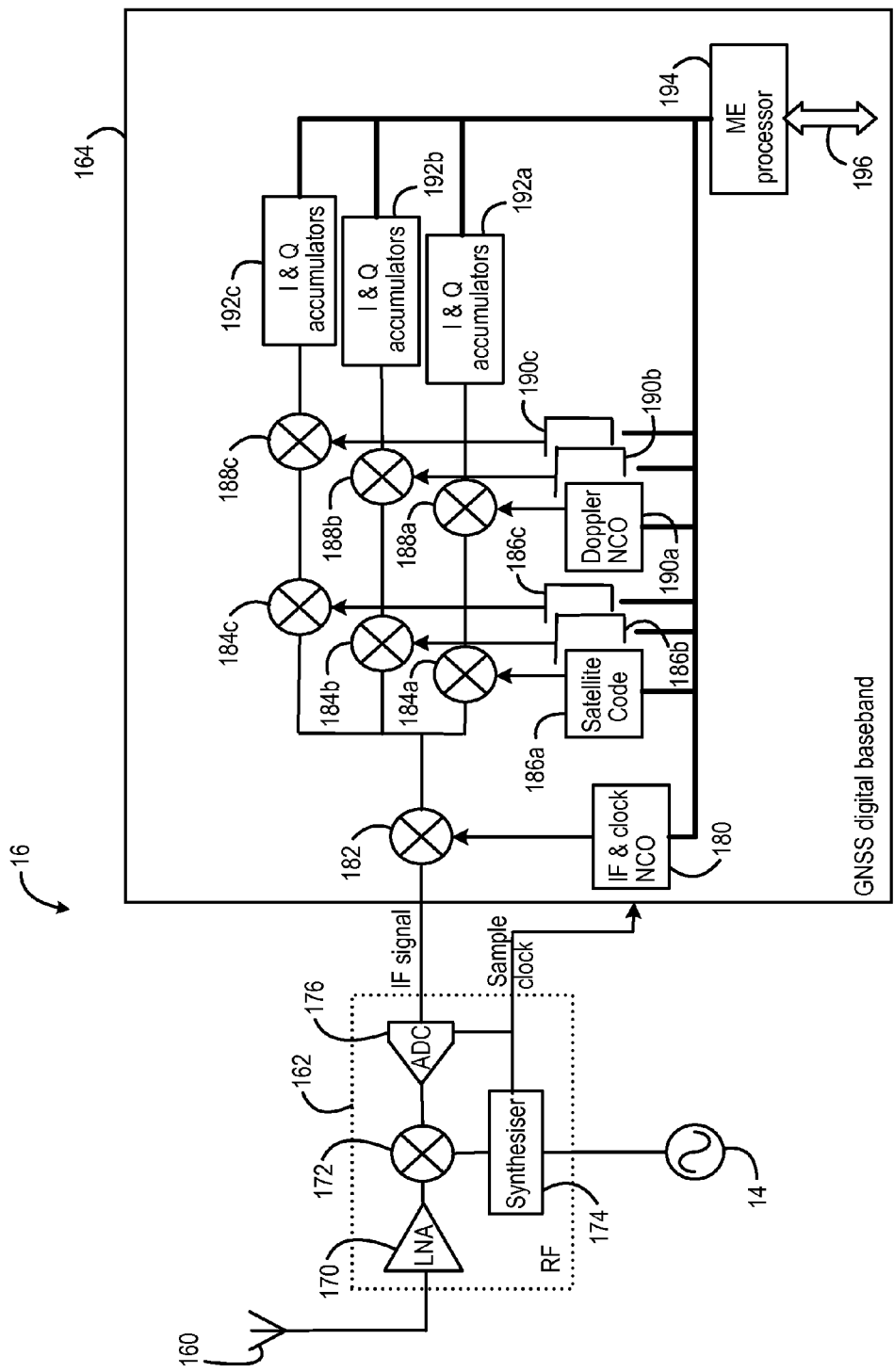
FIG. 2 is a schematic block diagram, illustrating in more detail a part of the receiver of FIG. 1.

FIG. 2 is a block schematic diagram, showing in more detail the form of the GNSS receiver 16, and its connection to the oscillator 14.

Specifically, the receiver 16 includes an antenna 160, analog RF receiver circuitry 162, and GNSS digital baseband circuitry 164. The RF circuitry 162 includes a low-noise amplifier (LNA) 170, for amplifying signals received by the antenna 160. The amplified signals are passed to a mixer 172, where they are downconverted to intermediate frequency (IF). The mixer 172 downconverts the received signal based on a signal received from a synthesiser 174, which in turn receives the signal generated by the oscillator 14. The downconverted signal is passed from the mixer 172 to an analog-digital converter 176, and the digital IF signal is passed to the digital baseband block 164.

The synthesiser 174 generates a signal at a nominal frequency, which is also passed to a numerically controlled oscillator (NCO) 180 in the GNSS baseband block 164. The NCO 180 generates a signal at the relevant intermediate frequency, for converting the IF signal to baseband in a mixer 182. The baseband signal is then passed to separate mixers 184a, 184b, 184c, which receive separate satellite identification codes from a respective code block 186a, 186b, 186c, in order to determine the respective correlations with the satellite identification codes, and form separate received signals from the available satellite vehicles (SVs) that are visible at the present time. Although three such signal paths are shown in FIG. 2, it will be appreciated that the number of such paths can be chosen to be any required number.

These separate signals are then passed to separate further mixers 188a, 188b, 188c, where they are mixed with separate signals received from a respective Doppler NCO block 190a, 190b, 190c, which provides the necessary correction for Doppler offsets caused by the different movements of the SVs relative to the receiver 10.

The resulting signals are passed to separate I&Q accumulator blocks 192a, 192b, 192c, where they are detected. The results of these signal detections are passed to a measurement engine (ME) processor 194. As is known, the ME processor 194 is able to calculate the position to a high degree of accuracy, provided that it is able to obtain the required fix on the signals transmitted by the SVs.

The ME processor 194 is also connected by a serial communications link 196 to the other components of the receiver 10, as shown in FIG. 1, as described in more detail below.

The receiver 10, shown in FIG. 1, also includes a temperature sensor 18, for example in the form of a thermistor. Preferably, the temperature sensor 18 is located close as possible to the oscillator 14, so that it can provide an accurate measurement of the temperature of the oscillator, at least to within the limits of the accuracy of the temperature sensor. The PCB-mounted temperature sensor 18 might typically be in the form of a negative temperature coefficient (NTC) resistor in series with a fixed resistor. When a known current or voltage is applied, the voltage drop across the NTC device is measured using an analog-digital converter (ADC). The resolution of the temperature sensor 18 needs to be fine enough to accurately measure temperature once the product has learned the crystal profile. For example, a temperature resolution of <0.15 K might be required. In any event, sensors of this type have limited accuracy, meaning that it is undesirable to use only such temperature measurements, particularly in view of the uncertainty of the crystal temperature-frequency profile, for frequency estimation.

Although reference is made here to a single temperature sensor, since NTC sensors are relatively low in cost, an array of sensors mounted around the crystal may be used to capture transient behaviour more accurately. For example, if two or more NTC resistors are placed around the crystal, the averaged temperature estimate will improve the measurements in a dynamic situation. In effect, the array of sensors form a temperature sensor producing a measure of the temperature of the oscillator from their combined individual measurements.

It is advantageous if the temperature of the oscillator 14 can be kept as constant as possible in use, and so the oscillator 14 and the temperature sensor 18 are mounted together on the PCB in an area that is as far as possible thermally isolated from the other components of the receiver, in order to minimise the effects of other parts of the receiver on the temperature of the oscillator. For example, the module containing the oscillator 14 and the temperature sensor 18 can be connected to the PCB by means of a small number of relatively narrow copper bridges, providing good electrical conductivity but poor thermal conductivity.

Thus, temperature measurements from the temperature sensor 18 provide a means of estimating the current clock frequency. A mathematical model of the clock frequency against temperature characteristic is stored in flash memory 20 of the receiver. An initial factory model may be programmed into the device, with provision for learning a more exact relationship for the particular crystal fitted, during use. For example, the model should have parameters to describe a third order temperature curve, an initial offset, and changes due to ageing, at least. Furthermore, crystal oscillators may exhibit so-called micro-jumps. As the temperature moves through a certain value, the frequency steps by a certain amount. The points at which these jumps occur are different from sample to sample. However, for a given sample they occur at roughly the same temperature value each time. Predictive estimation of temperature changes therefore allows the GNSS receiver to anticipate a frequency step as well as correct for it once it has occurred.

The measured temperature of the oscillator is therefore used by a temperature-to-frequency conversion block 22 to form an estimate of the clock frequency, based on the characteristic stored in the memory 20.

In addition, the cellular transceiver 12 provides a means for forming an estimate of the current clock frequency when the cellular transceiver 12 is frequency locked to the cellular network. That is, the cellular transceiver must transmit signals to the cellular network at frequencies that have frequency errors of no more than 0.1 ppm, compared with the nominal frequencies, and similarly rely on the clock frequency being sufficiently close to the nominal frequency in order to be able to receive signals transmitted by the network successfully. Thus, the cellular transceiver 12 is able to estimate the frequency of the clock signal received from the oscillator 14.

The first estimate of the current clock frequency produced by the temperature-to-frequency conversion block 22, and the second estimate of the current clock frequency produced by the cellular transceiver 12 are then passed to a combiner 24, which forms a combined estimate of the current clock frequency, depending on the usage situation of the receiver 10.

In practice, the absolute tolerance of the estimate from the communications transceiver 12 is better than the tolerance of the temperature based estimate. On the other hand, the estimate from the communications transceiver 12 is noisier, and is affected by user motion. In particular, this makes it less suitable for estimating the frequency rate of change. For this parameter, estimates based on temperature measurements are critical.

Once the GNSS receiver 16 is successfully tracking satellite signals, especially at high signal to noise ratios, it too is able to provide estimates for the frequency and rate of frequency change of the oscillator 14, and these estimates are typically more accurate than those that can be obtained from the communications transceiver or from the temperature measurements. Thus, the estimates provided by the GNSS receiver are also passed to the combiner 24, which produces a combined estimate of the frequency, based on these estimates.

As well as estimating the current frequency of the signals generated by the oscillator, the receiver attempts to anticipate changes in the frequency. Specifically, changes in the usage of the receiver cause heat to be generated in the device, which in turn cause changes in the temperature of the oscillator, and hence changes in the frequency. As described below, the combined estimate can be corrected based on dynamic temperature changes.

Thus, as shown in FIG. 1, the receiver includes a component 26 that acts as a heat source. That is, the component generates heat at certain times. For example, the heat source 26 might be the cellular transceiver chip 12, where this is provided as a single separate integrated circuit. In general, there may be multiple such heat sources, all of which can be taken into consideration in the same way. Thus, the heat source 26 does not act as a constant source of heat, but rather it only generates heat at certain times, for example when the receiver 10 is in a cellular call, or is transmitting data over a cellular wireless link.

The operation of the heat source is monitored by a controller 28, which has information about the components of the receiver 10 that are in use.

The information about the usage of the various heat sources is passed to a thermal model 30, which is used to model and predict rapid changes in temperature of the oscillator crystal.

Figure 3:
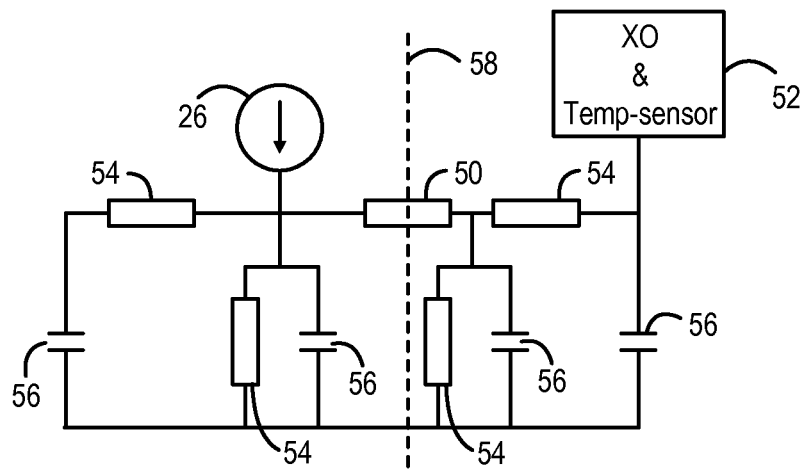
FIG. 3 illustrates the use of a thermal model, in the receiver of FIG. 1.

FIG. 3 is a schematic representation of the thermal model 30, representing the heat flow between the heat source and the crystal module. FIG. 3 represents the various parameters in terms of an equivalent electrical circuit, in which electrical resistance represents thermal resistance (in Kelvin/Watt), electrical capacitance represents heat capacitance (in Joules/Kelvin), electric current represents heat flow (in Watts), and the equivalent of voltage is temperature (in Kelvin).

FIG. 3 shows a typical form of a thermal model, in the case where only one heat source 26 is located close enough to the crystal unit 14 on the PCB to cause significant temperature acceleration. In principle, the crystal temperature is ultimately affected by the ambient temperature, and by all heat sources in the user device, such as power amplifiers, display drivers, and the like. However, a dedicated thermal design of the receiver preferably ensures that the crystal temperature evolves slowly i.e. thermal time constants of tens of seconds or longer. Thus, the crystal unit 14 and temperature sensor 18 are co-located several millimeters away from the nearest heat source, and a thermal break 50 (resulting from gaps in copper layers in the PCB) encircles the two components 52. The thermally isolated area is kept large (several millimeters radius) to provide significant thermal capacitance. With these simple measures, only very few components located on the PCB have the potential to cause rapid changes in crystal temperature.

Thus, the thermal model 30 contains various thermal resistances 54 and capacitances 56, where the topology and the component values are chosen so as to capture the changes in the temperature of the oscillator 14 due to the heat source 26. The resistances 54 and capacitances 56 to the left of the dashed line 58 represent the properties of the PCB outside the thermal break 50, while the resistances 54 and capacitances 56 to the right of the dashed line 58 represent the properties of the PCB inside the thermal break 50. The model is chosen to capture the underlying mechanical properties. Thermal resistance on a PCB relates primarily to the presence of copper connections, because the glass-fibre substrate material is a poor conductor of heat. Specific heat capacitance is an intrinsic material property, and the total heat capacitance is dependent on the material dimensions. In this case, the purpose of the model is to react quickly to changes in temperature that will be caused by changes in the heat input from the heat source 26, and so the model does not require accurate modelling of slow variations in temperature, which are directly tracked by the temperature sensor.

Using the thermal model 30, the temperature dynamics of the crystal oscillator may be found by integrating the heating power injected by the heat source 26 in time. The thermal model 30 is resident on a processor, and the integration is performed numerically in the processor by filtering sampled values of the injected heating power. The filter coefficients are chosen such that the filtering yields the same transfer function from heat source to crystal unit as the nodal model 30.

Although FIGS. 1 and 3 shows only a single temperature sensor, positioned such that it can detect the temperature of the crystal oscillator, further temperature sensors positioned on the circuit board can also provide useful information, for example in confirming the accuracy of the thermal model.

Thus, the thermal model 30 can be used to estimate the effect of the nearby heat sources 26 on the temperature of the oscillator 14, over the next one second. This is passed to the temperature-to-frequency conversion block 22, to determine an estimated effect of the nearby heat sources 26 on the frequency of the oscillator 14, over the next one second. This estimated effect is then added in the block 32 to the estimated current value of the frequency derived in the block 24.

The resulting prediction of the frequency is used to provide a frequency aiding update to the GNSS receiver 16. Specifically, the frequency aiding update is supplied to the ME processor 194 of the GNSS receiver 16 over the serial communications link 196 at a rate of typically once per second. Because the time delay between changing the injected heating current and a temperature change in the crystal is larger than the one second update rate, this model is able to forecast temperature and therefore frequency changes due to the local heat source.

As mentioned above, in this illustrated embodiment, the GNSS receiver 16 is provided with a frequency and rate of frequency change estimate once a second. As long as the frequency acceleration ($d^2f/dt^2$) is small, these parameters allow the GNSS receiver to counteract movements in the reference clock by linearly extrapolating the frequency evolution over the following second. If, however, the frequency acceleration is larger, exceeding roughly 10 Hz/s$^2$, the performance may be degraded because the satellite signal moves outside the receiver bandwidth over the time between two frequency updates. Because fast frequency acceleration is caused by temperature acceleration, the extrapolation error may be removed by adjusting the frequency drift estimate before it is sent to the GNSS receiver. As a result, the GNSS signal stays within the receiver bandwidth for the duration between two frequency aiding updates, even when the crystal unit is subject to thermal shocks.

Figure 4:
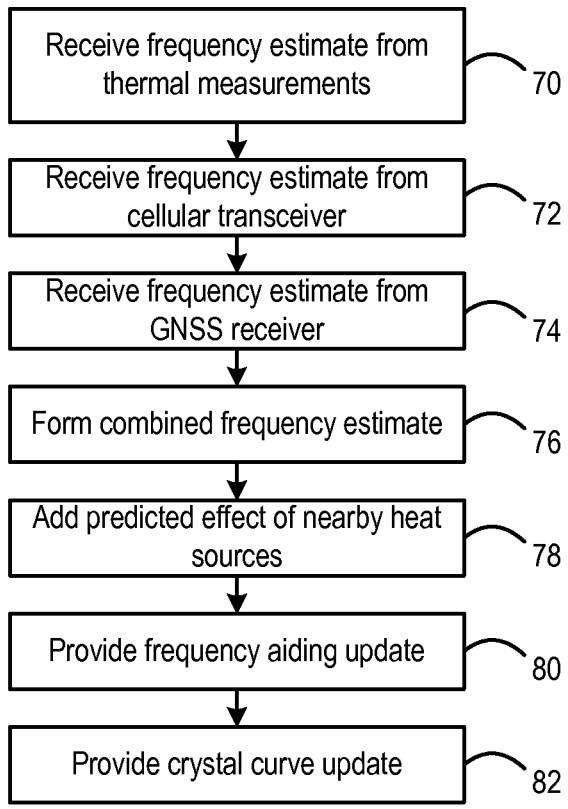
FIG. 4 is a flow chart, illustrating a method in accordance with an aspect of the invention.

FIG. 4 is a flow chart, illustrating a method in accordance with an aspect of the invention, performed in the combiner 24 and the adder 32, it being understood FIG. 1 shows these components schematically, and that these functions might advantageously be performed in a processor within the GNSS receiver 16.

Thus, in step 70, the combiner 24 receives the estimate of the current frequency of the oscillator 14, based on the measurement from the temperature sensor 18, and based on the stored temperature-frequency characteristic. In step 72, the combiner 24 receives the estimate of the current frequency of the oscillator 14, from the cellular transceiver 12, if such an estimate is available. In step 74, the combiner 24 receives the estimate of the current frequency of the oscillator 14, from the GNSS receiver 16, if such an estimate is available.

In step 76, these estimates are weighted, to form a combined estimate. The resulting information might consist of: an estimate of current frequency, an estimate of the rate of change of frequency, an error margin for the frequency estimate, and an error margin of the frequency change rate estimate, where the error margins relate to the maturity of the crystal curve (i.e. the frequency versus measured temperature characteristic of the crystal) model. The weighting of the different estimates varies over time. As mentioned above, the estimates based on the measured temperature and derived from the cellular transceiver might have different reliabilities at different times, and the estimate derived from the GNSS receiver 16 itself might be the most reliable when the receiver is locked onto the satellite signals.

For example, if three estimates of drift are Dt, Dm, Dg, derived from the temperature, cellular transceiver 12 and GNSS receiver 16 respectively, with respective accuracies At, Am, Ag, then a final, weighted, estimate of drift might be:

$$DtAmAg/A + DmAtAg/A + DgAtAm/A \text{ where } A = (AmAg + AtAg + AtAm).$$

In step 78, the predicted effect of the heat sources 26 on the frequency, resulting from the predicted effect on the temperature of the oscillator 14, is added to the combined estimate of the current frequency, in order to form an estimate of the frequency that will be usable for the next second.

This estimate is then provided in step 80 as a frequency aiding update for use in the GNSS receiver 16. In the illustrated embodiment shown in FIG. 2, each SV channel has its own Doppler NCO 190a, 190b, 190c, while the whole baseband has a common IF NCO 180, which is programmed to remove the final IF frequency. This same IF NCO 180 is also useful for removing any reference frequency offsets. Therefore, in the illustrated embodiment, the clock frequency drift corrections are applied in the IF NCO 180. Once the drift and steps are removed by the IF NCO, the following circuits only experience the Doppler as they would have done with an uncorrupted clock.

As alternatives, the frequency aiding update can be applied either to tune the crystal oscillator directly, to change the synthesizer 174 that feeds the mixer 172 that downconverts the received signal from RF to IF, or in the individual Doppler NCOs 190a, 190b, 190c for each satellite.

Also, in step 82, the combined estimate of the current frequency is fed back to a block 54, where it is used to determine whether it is necessary to refine the currently stored crystal curve. If so, any change is stored in the flash memory 20 of the receiver 10. The frequency model (e.g. a 5$^{th}$ order polynomial) is stored in conjunction with a model of its uncertainty or error (e.g. a polynomial with only even order terms so that the error is strictly positive). Whenever a frequency measurement with good accuracy is available, then the frequency model can be updated and the associated uncertainty reduced. This scheme can run continuously, using only the estimates from the cellular transceiver and based on the measured temperature, even before the GNSS receiver 16 is enabled for the first time. This means that a good estimate of frequency, perhaps based only on temperature measurements, can be available before the GNSS receiver requires it.

Thus, the present invention provides a system whereby, based on the system activity, crystal temperature movements are forecast, allowing the GNSS receiver to anticipate frequency movements accordingly.

The invention claimed is:

1. A communications device, comprising:
    an oscillator, having a temperature-dependent frequency characteristic, for generating signals at a nominal frequency;
    receiver circuitry, for receiving transmitted wireless signals using the signals generated by the oscillator;
    at least one temperature sensor, having a known positional relationship to the oscillator;
    an estimation device, for estimating a frequency of the signals generated by the oscillator, based on a measurement from the temperature sensor, and based on the temperature-dependent frequency characteristic of the oscillator;
    at least one heat source wherein the temperature sensor and the oscillator are mounted on a printed circuit board (PCB) and co-located away from the heat source in a thermally isolated area surrounded by a thermal break, wherein the thermal break comprises one or more gaps in one or more layers of the PCB; and
    a prediction device, for predicting a change in temperature of the oscillator, based on a state of the heat source, and further based on a model of the thermal properties of the communications device, and hence for predicting a change in the frequency of the signals generated by the oscillator, based on the temperature-dependent frequency characteristic of the oscillator,
    wherein the receiver circuitry uses the estimated frequency of the signals generated by the oscillator, and the predicted change in the frequency of the signals generated by the oscillator, in receiving the transmitted wireless signals.

2. The communications device as claimed in claim 1, wherein the heat source is a component of the communications device, and the prediction device is adapted to predict an increase in temperature of the oscillator following activation of the component.

3. The communications device as claimed in claim 2, wherein the heat source is a transceiver circuit of the communications device.

4. The communications device as claimed in claim 1, wherein the prediction device is further adapted to predict a rate of change of a frequency of a signal generated by the oscillator, based on a model of the temperature-dependent frequency characteristic of the oscillator.

5. The communications device as claimed in claim 4, wherein the prediction device is further adapted to update the model of the temperature-dependent frequency characteristic of the oscillator based on successfully received signals.

6. The communications device as claimed in claim 1, wherein the receiver circuitry is adapted to receive frequency aiding updates at predetermined time intervals, and the prediction device is adapted to predict, for each of said predetermined time intervals, a change in the frequency of the signals generated by the oscillator over said time interval.

7. The communications device as claimed in claim 6, wherein the predetermined time intervals are approximately one second.

8. The communications device as claimed in claim 6, wherein the oscillator and the heat source are separated by a thermal resistance such that a change in the state of the heat source has no significant impact on the temperature of the oscillator within one predetermined time interval.

9. The communications receiver as claimed in claim 1, wherein the receiver circuitry comprises a GNSS receiver.

10. The communications receiver as claimed in claim 9, wherein the GNSS receiver circuitry comprises a downconversion mixer, for downconverting a frequency of a received signal based on an oscillator signal, and individual oscillators for tracking signals from respective satellite vehicles, and wherein the receiver circuitry uses the estimated frequency of the signals generated by the oscillator, and the predicted change in the frequency of the signals generated by the oscillator, in the downconversion mixer.

11. The communications receiver as claimed in claim 9, wherein the estimation device estimates the frequency of the signals generated by the oscillator, based also on measurements from the GNSS receiver.

12. The communications receiver as claimed in claim 9, further comprising cellular transceiver circuitry, for communicating in a cellular communications network, wherein the estimation device estimates the frequency of the signals generated by the oscillator, based also on measurements from the cellular transceiver.

13. A method of operation of a communications device, the communications device comprising:
    an oscillator, having a temperature-dependent frequency characteristic, for generating signals at a nominal frequency;
    receiver circuitry, for receiving transmitted wireless signals using the signals generated by the oscillator;
    at least one temperature sensor, having a known positional relationship to the oscillator; and
    at least one heat source wherein the temperature sensor and the oscillator are mounted on a printed circuit board (PCB) and co-located away from the heat source in a thermally isolated area surrounded by a thermal break, wherein the thermal break comprises one or more gaps in one or more layers of the PCB; the method comprising:
    estimating a frequency of the signals generated by the oscillator, based on a measurement from the temperature sensor, and based on the temperature-dependent frequency characteristic of the oscillator;
    predicting a change in temperature of the oscillator, based on a state of the heat source, and further based on a model of the thermal properties of the communications device, and hence predicting a change in the frequency of the signals generated by the oscillator, based on the temperature-dependent frequency characteristic of the oscillator, and
    using the estimated frequency of the signals generated by the oscillator, and the predicted change in the frequency of the signals generated by the oscillator, in receiving the transmitted wireless signals in the receiver circuitry.

14. The method as claimed in claim 13, wherein the heat source is a component of the communications device, comprising predicting an increase in temperature of the oscillator following activation of the component.

15. The method as claimed in claim 13, comprising predicting a rate of change of a frequency of a signal generated by the oscillator, based on a model of the temperature-dependent frequency characteristic of the oscillator.

16. The method as claimed in claim 15, comprising updating the model of the temperature-dependent frequency characteristic of the oscillator based on successfully received signals.

17. The method as claimed in claim 13, comprising predicting, for each of a plurality of predetermined time intervals, a change in the frequency of the signals generated by the oscillator over said time interval, and using the predicted changes in the receiver circuitry during the predetermined time intervals.

18. The method as claimed in claim 13, wherein the receiver circuitry comprises a GNSS receiver, and wherein the GNSS receiver circuitry comprises a downconversion mixer, for downconverting a frequency of a received signal based on an oscillator signal, and individual oscillators for tracking signals from respective satellite vehicles, and wherein the method comprises using the estimated frequency of the signals generated by the oscillator, and the predicted change in the frequency of the signals generated by the oscillator, in the downconversion mixer.

19. The method as claimed in claim 18, comprising estimating the frequency of the signals generated by the oscillator, based also on measurements from the GNSS receiver.

20. The method as claimed in claim 18, wherein the communications device further comprises cellular transceiver circuitry, for communicating in a cellular communications network, and the method comprises estimating the frequency of the signals generated by the oscillator, based also on measurements from the cellular transceiver.

* * * * *